(12) United States Patent
Abatake et al.

(10) Patent No.: US 11,165,408 B2
(45) Date of Patent: Nov. 2, 2021

(54) METHOD OF MANUFACTURING SUBSTRATE FOR ACOUSTIC WAVE DEVICE

(71) Applicant: DISCO CORPORATION, Tokyo (JP)

(72) Inventors: Jun Abatake, Tokyo (JP); Kenya Kai, Tokyo (JP); Kentaro Shiraga, Tokyo (JP); Keiji Nomaru, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 448 days.

(21) Appl. No.: 16/042,097

(22) Filed: Jul. 23, 2018

(65) Prior Publication Data

US 2019/0044494 A1    Feb. 7, 2019

(30) Foreign Application Priority Data

Aug. 2, 2017  (JP) .............................. JP2017-150237

(51) Int. Cl.
*H03H 3/02*          (2006.01)
*H03H 3/08*          (2006.01)
(Continued)

(52) U.S. Cl.
CPC ..... *H03H 9/02574* (2013.01); *B23K 26/0006* (2013.01); *B23K 26/03* (2013.01);
(Continued)

(58) Field of Classification Search
CPC ... H01L 41/313; H01L 41/335; H01L 41/337; H03H 3/02; H03H 9/02574; H03H 3/08; B23K 26/0006; B23K 26/03; B23K 26/0622; B23K 26/082; B23K 26/57; B23K 26/361; B24B 7/228; G01B 11/0883; Y10T 29/42
See application file for complete search history.

(56) References Cited

U.S. PATENT DOCUMENTS

| 5,389,196 A * | 2/1995 | Bloomstein ..........B23K 26/361 |
| | | 216/66 |
| 2010/0156241 A1* | 6/2010 | Suzuki .................. H01L 41/337 |
| | | 310/325 |
| 2017/0170385 A1* | 6/2017 | Nagae ................... H01L 41/337 |

FOREIGN PATENT DOCUMENTS

| JP | 11116387 A * | 4/1999 ......... H03H 9/02582 |
| JP | 2015159499 A | 9/2015 |
| WO | 0041299 A1 | 7/2000 |

* cited by examiner

*Primary Examiner* — A. Dexter Tugbang
(74) *Attorney, Agent, or Firm* — Greer, Burns & Crain, Ltd.

(57) ABSTRACT

A method of manufacturing a substrate for an acoustic wave device includes: a substrate joining step of joining a piezoelectric material layer to a surface on one side of a support substrate; a grinding step of grinding the piezoelectric material layer; a removal amount map forming step of measuring in-plane thickness of the piezoelectric material layer by an optical thickness meter, and calculating a removal amount for the piezoelectric material layer for adjusting thickness variability of the piezoelectric material layer to or below a threshold on the basis of each coordinate in the plane, to form a removal amount map; a laser processing step of applying a pulsed laser beam of such a wavelength as to be absorbed in the piezoelectric material layer, to selectively remove the piezoelectric material layer, based on the removal amount map; and a polishing step of polishing the surface of the piezoelectric material layer.

9 Claims, 9 Drawing Sheets

(51) Int. Cl.
*H01L 41/337* (2013.01)
*H03H 9/02* (2006.01)
*B23K 26/00* (2014.01)
*B23K 26/0622* (2014.01)
*B23K 26/082* (2014.01)
*B23K 26/361* (2014.01)
*B23K 26/03* (2006.01)
*H01L 41/313* (2013.01)
*H01L 41/335* (2013.01)
*B23K 26/57* (2014.01)
*G01B 11/06* (2006.01)
*B24B 7/22* (2006.01)

(52) U.S. Cl.
CPC ........ *B23K 26/0622* (2015.10); *B23K 26/082* (2015.10); *B23K 26/361* (2015.10); *B23K 26/57* (2015.10); *G01B 11/0683* (2013.01); *H01L 41/313* (2013.01); *H01L 41/335* (2013.01); *H01L 41/337* (2013.01); *H03H 3/08* (2013.01); *B24B 7/228* (2013.01); *H03H 3/02* (2013.01); *Y10T 29/42* (2015.01)

METHOD OF MANUFACTURING SUBSTRATE FOR ACOUSTIC WAVE DEVICE

BACKGROUND OF THE INVENTION

Field of the Invention

The present invention relates to a method of manufacturing a substrate for an acoustic wave device.

Description of the Related Art

In radio communication apparatuses such as mobile phones, a band pass filter that permits electrical signals in a desired frequency band to pass therethrough plays an important role. As one of the band pass filters, there has been known a SAW (Surface Acoustic Wave) device (SAW filter) utilizing a SAW.

In recent years, attention has been paid to a BAW (Bulk Acoustic Wave) device (BAW filter) utilizing a BAW propagated through the inside of a substance. A BAW device has a resonator (piezoelectric element) in which a piezoelectric film formed of a piezoelectric material is sandwiched between electrodes of molybdenum (Mo) or the like. The resonator is formed on a support substrate formed of a semiconductor material such as silicon (Si), for example. The BAW device does not have a tooth-shaped electrode structure, unlike the SAW device, and is therefore advantageous for a reduced loss and an enhanced electric power proofness. In addition, since it is unnecessary to use a crystal substrate formed of a piezoelectric material, the BAW device can be formed integrally with other active device.

In this way, piezoelectric elements utilizing a piezoelectric composite substrate provided with a single crystal thin film of a piezoelectric material have been developed. Piezoelectric materials such as LT ($LiTaO_3$) and LN ($LiNbO_3$), having a high electromechanical coupling factor, are advantageous for realizing a wide-band filter characteristic, but has a drawback of being poor in temperature stability. On the other hand, support substrates of sapphire, silicon and the like are excellent in temperature stability but have a drawback of a low electromechanical coupling factor. In contrast, a piezoelectric composite substrate obtained by joining both of them has an advantage of having a high electromechanical coupling factor and excellent temperature stability. In addition, the piezoelectric composite substrate is advantageous in that when a piezoelectric material joined to a support substrate is formed thinner, the proportion of vibration (kinetic energy) not utilized because of its propagation in the thickness direction of the piezoelectric element utilizing a surface acoustic wave or a bulk acoustic wave is reduced, and the vibration can be thereby detected efficiently.

The piezoelectric material joined to the support substrate exhibits a filter characteristic in response to acoustic waves, and, therefore, it is necessary to set a threshold for thickness variability to a very low value (for example, a value of not more than 2 μm, typically approximately 0.1 μm to 2 μm). However, the thickness variability of the support substrate is normally not less than 2 μm. In view of this, there has been proposed a method in which a single crystal base material joined to a support substrate is exfoliated by a pretreatment such as ion injection, to form a thin film (see, for example, Japanese Translations of PCT for Patent No. 2002-534886). In addition, there is also proposed a method in which a single crystal base material is thinned after joined to a support substrate (see, for example, Japanese Patent Laid-open No. 2015-159499).

SUMMARY OF THE INVENTION

However, the method disclosed in Japanese Translations of PCT for Patent No. 2002-534886 has a problem in that since the cost of exfoliation such as ion injection is high, this method cannot be easily adopted for the manufacture of a SAW filter as an acoustic wave device which is not high in product unit price. In addition, the method disclosed in Japanese Patent Laid-open No. 2015-159499 has a problem in that since in-plane thickness variability of the support substrate is present, the thickness variability of the thin film cannot be reduce to or below the in-plane thickness variability of the support substrate.

It is therefore an object of the present invention to provide a method of manufacturing a substrate for an acoustic wave device by which thickness variability of a piezoelectric material layer can be suppressed while suppressing the cost of acoustic wave devices.

In accordance with an aspect of the present invention, there is provided a method of manufacturing a substrate for an acoustic wave device, the substrate having a piezoelectric material layer with a predetermined thickness formed along a surface on one side of a support substrate, the method including: a substrate joining step of joining the piezoelectric material layer to the surface on the one side of the support substrate; a grinding step of holding the support substrate side by a chuck table of a grinding apparatus and grinding and thinning the piezoelectric material layer, after the substrate joining step; a removal amount map forming step of measuring in-plane thickness of the piezoelectric material layer by an optical thickness meter, calculating a removal amount for the piezoelectric material layer for adjusting thickness variability of the piezoelectric material layer to or below a threshold on the basis of each coordinate in the plane, to form a removal amount map, after the grinding step; a laser processing step of applying a pulsed laser beam of such a wavelength as to be absorbed in the piezoelectric material layer from a surface of the piezoelectric material layer, and selectively removing the piezoelectric material layer by ablation processing, based on the removal amount map, to adjust the thickness variability to or below the threshold; and a polishing step of holding the support substrate side by a chuck table of a polishing apparatus, and polishing the surface of the piezoelectric material layer by a polishing pad, to form the piezoelectric material layer of a predetermined thickness while maintaining the in-plane thickness variability, after the laser processing step.

In the method of manufacturing the substrate for the acoustic wave device, scanning conditions of the pulsed laser beam applied in the laser processing step may be determined from a removal amount of the piezoelectric material layer per pulse that is preliminarily measured.

In the method of manufacturing the substrate for the acoustic wave device, in the grinding step, the surface of the piezoelectric material layer may be ground by a rough grinding grindstone, after which the surface of the piezoelectric material layer may be finish-ground by a finish grinding grindstone finer in abrasive grain size than the rough grinding grindstone, to restrain irregular reflection of measurement light of the optical thickness meter.

In the method of manufacturing the substrate for the acoustic wave device, the polishing step may be chemical mechanical polishing processing.

In the method of manufacturing the substrate for the acoustic wave device, the support substrate may be lower in thermal expansion coefficient than the piezoelectric material layer, and may be a semiconductor or an insulating material.

The present invention produces an effect that thickness variability of a piezoelectric material layer can be suppressed while suppressing the cost of an acoustic wave device.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A mode (embodiment) for carrying out the present invention will be described in detail below with reference to the drawings. The present invention is not to be limited by the contents of the embodiment described below. In addition, the constituent elements described below include those easily conceivable by a person skilled in the art and those which are substantially equivalent. Further, the configurations described below can be combined as required. Besides, various omissions, replacements and modifications of the configurations are possible without departing from the gist of the present invention.

Embodiment 1

Figure 1:
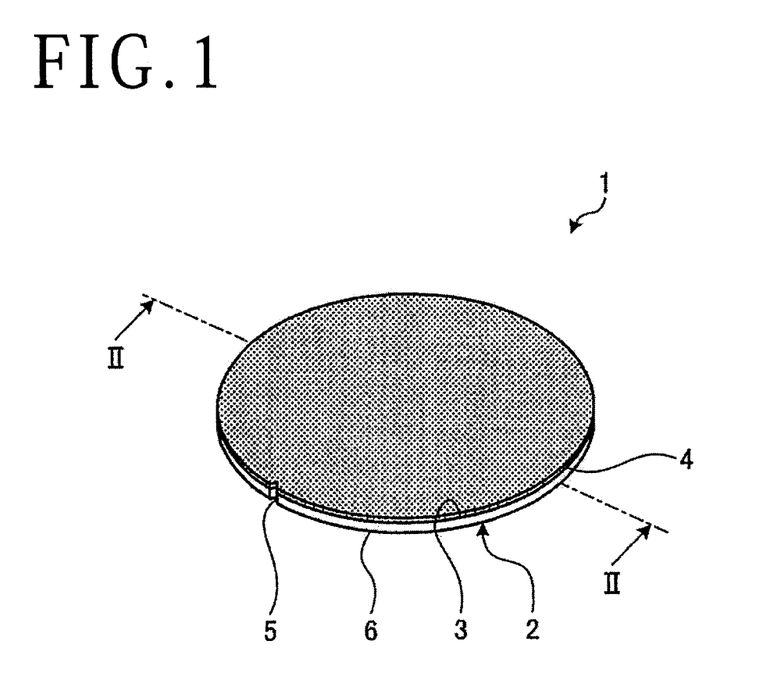
FIG. 1 is a perspective view of a substrate for a SAW filter obtained by the method of manufacturing a substrate for an acoustic wave device according to Embodiment 1.
Figure 2:
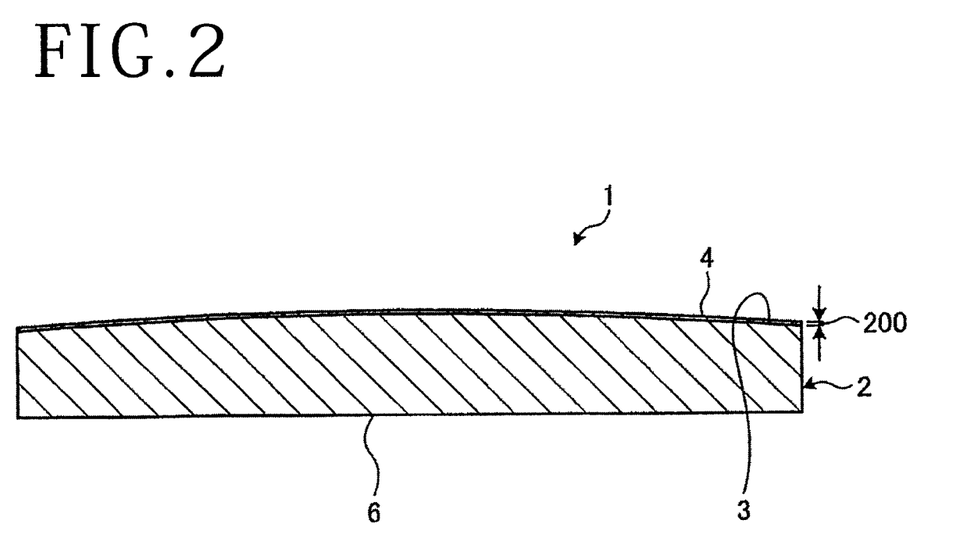
FIG. 2 is a sectional view taken along line II-II of FIG. 1.

A method of manufacturing a substrate for an acoustic wave device according to Embodiment 1 of the present invention will be described based on the drawings. FIG. 1 is a perspective view of a substrate for a SAW filter obtained by the method of manufacturing the substrate for the acoustic wave device according to Embodiment 1. FIG. 2 is a sectional view taken along line II-II of FIG. 1.

The method of manufacturing the substrate for the acoustic wave device according to Embodiment 1 is a method of manufacturing a substrate 1 for a SAW filter, which is the substrate for the acoustic wave device depicted in FIGS. 1 and 2. The SAW filter substrate 1 is divided into SAW filters, which are acoustic wave devices having a predetermined size. As depicted in FIGS. 1 and 2, the SAW filter substrate 1 has a configuration in which a piezoelectric material layer 4 having a predetermined thickness 200 is formed along a surface 3 on one side of a support substrate 2. The support substrate 2 is lower in thermal expansion coefficient than the piezoelectric material layer 4, and is a semiconductor or an insulating material. In Embodiment 1, the support substrate 2 is formed of quartz glass or silicon which is lower in thermal expansion coefficient than the piezoelectric material layer 4, and, in Embodiment 1, it is formed in a circular disk shape. In the present invention, however, the support substrate 2 is not limited to a circular disk shape. Besides, in Embodiment 1, the support substrate 2 is a silicon wafer formed of silicon, and is therefore provided with a notch 5 indicative of crystal orientation. Of the support substrate 2, the difference between the thickness of a thinnest portion and the thickness of a thickest portion is approximately 3 µm. Note that in Embodiment 1, the support substrate 2 is the thickest in the center, and is the thinnest at the peripheral edge. Note that while the SAW filter substrate 1 is manufactured by the method of manufacturing the substrate for the acoustic wave device according to Embodiment 1, a substrate for a BAW filter as a substrate for an acoustic wave device may be manufactured in the present invention. The manufactured BAW filter substrate is divided into BAW filters, which are acoustic wave devices having a predetermined size.

The piezoelectric material layer 4 is joined to the surface 3 on the one side of the support substrate 2. The piezoelectric material layer 4 is formed of LT (LiTaO$_3$) or LN (LiNbO$_3$), which is a piezoelectric material. The predetermined thickness 200 of the piezoelectric material layer 4 is 1 µm to 2 µm, and the difference between the thickness of the thinnest portion and the thickness of the thickest portion is not more than 5.0 μm, for example, 0.5 μm to 5.0 μm, and is desirably approximately 1 μm.

Figure 3:
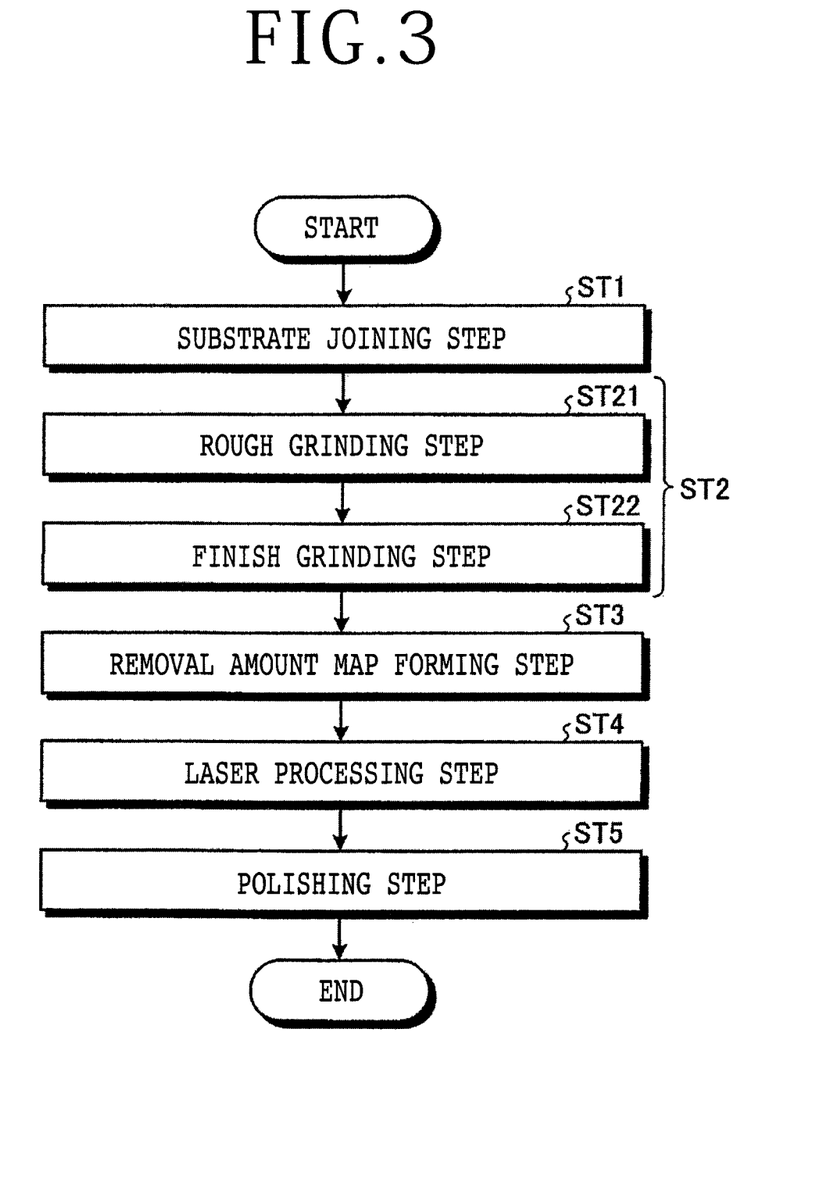
FIG. 3 is a flow chart depicting the method of manufacturing the substrate for the acoustic wave device according to Embodiment 1.

The method of manufacturing the substrate for the acoustic wave device according to Embodiment 1 will be described below. FIG. 3 is a flow chart depicting the method of manufacturing the substrate for the acoustic wave device according to Embodiment 1. As depicted in FIG. 3, the method of manufacturing the substrate for the acoustic wave device according to Embodiment 1 (hereinafter referred to simply as the manufacturing method) includes a substrate joining step ST1, a grinding step ST2, a removal amount map forming step ST3, a laser processing step ST4, and a polishing step ST5.

<Substrate Joining Step>

Figure 4:
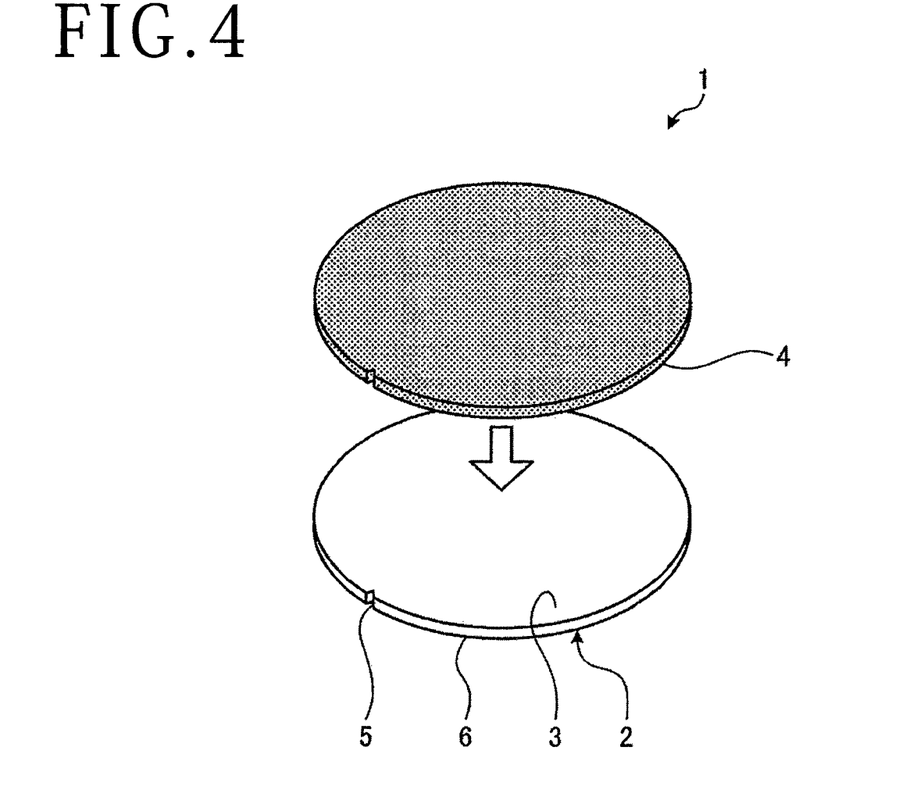
FIG. 4 is a perspective view depicting a substrate joining step in the method of manufacturing the substrate for the acoustic wave device depicted in FIG. 3.
Figure 5:
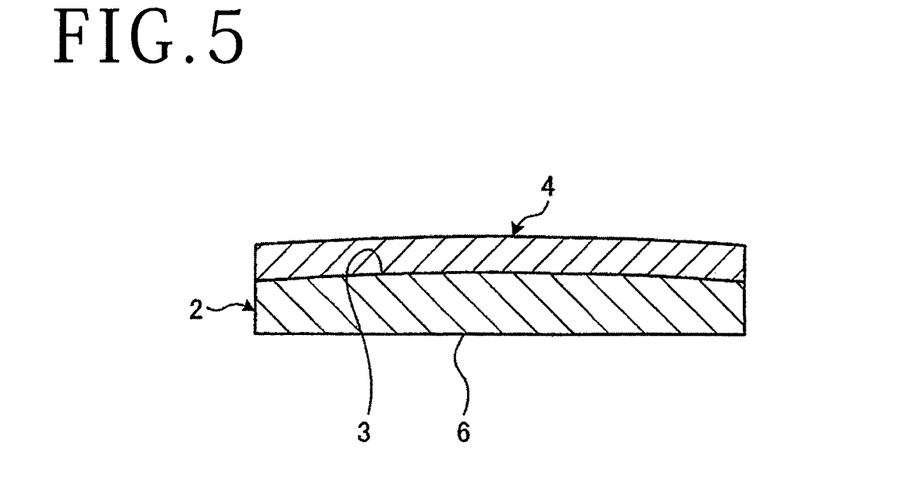
FIG. 5 is a sectional view of a support substrate and a piezoelectric material layer after the substrate joining step in the method of manufacturing the substrate for the acoustic wave device depicted in FIG. 3.

FIG. 4 is a perspective view depicting a substrate joining step in the method of manufacturing the substrate for the acoustic wave device depicted in FIG. 3. FIG. 5 is a sectional view of the support substrate and the piezoelectric material layer after the substrate joining step in the method of manufacturing the substrate for the acoustic wave device depicted in FIG. 3. The substrate joining step ST1 is a step of joining the piezoelectric material layer 4 to the surface 3 on the one side of the support substrate 2. As depicted in FIG. 4, in the substrate joining step ST1, the surface 3 on the one side of the support substrate 2 and the piezoelectric material layer 4 are made to face each other, and then the piezoelectric material layer 4 is joined to the surface 3 on the one side of the support substrate 2. In Embodiment 1, in the substrate joining step ST1, the support substrate 2 and the piezoelectric material layer 4 are adhered to each other through an organic adhesive layer, but they may be integrated together by direct joining. Examples of the material of the organic adhesive layer include epoxy resin and acrylic resin. The direct joining is conducted by activating joining surfaces of the support substrate 2 and the piezoelectric material layer 4, and pressing the support substrate 2 and the piezoelectric material layer 4 in the state in which both the joining surfaces face each other. Examples of the method for activating the joining surfaces include application of an ion beam of an inert gas (argon, etc.) to the joining surfaces, and application of a plasma or a neutron atomic beam to the joining surfaces. After the substrate joining step ST1, as depicted in FIG. 5, the piezoelectric material layer 4 is in close contact with the surface 3 on the one side, and is curved along the surface 3 on the one side. After the substrate joining step ST1, the manufacturing method proceeds to the grinding step ST2.

<Grinding Step>

Figure 6:
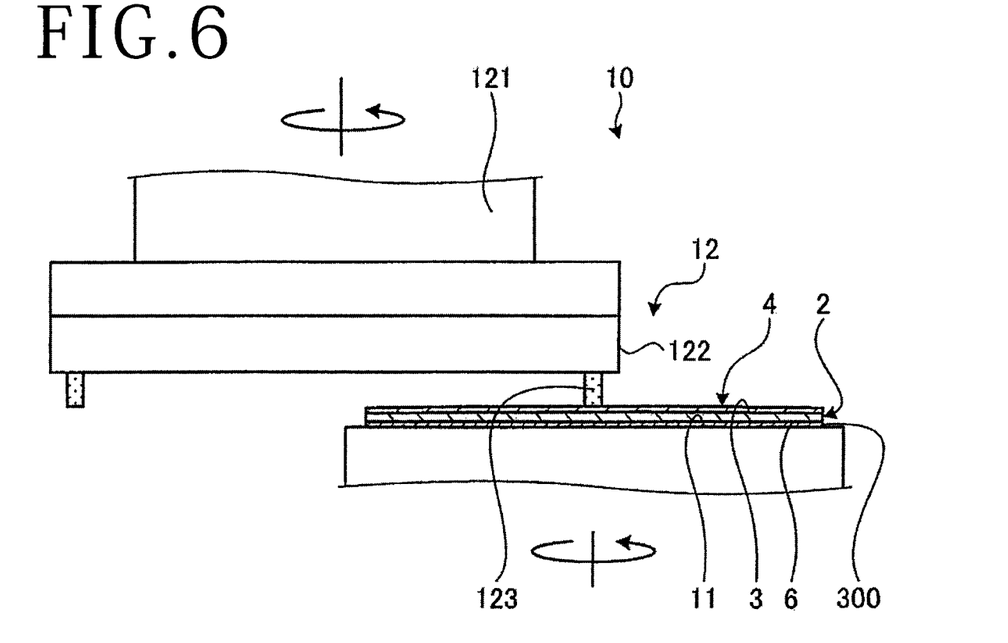
FIG. 6 is a partially sectional side view depicting a rough grinding step of a grinding step in the method of manufacturing the substrate for the acoustic wave device depicted in FIG. 3.
Figure 7:
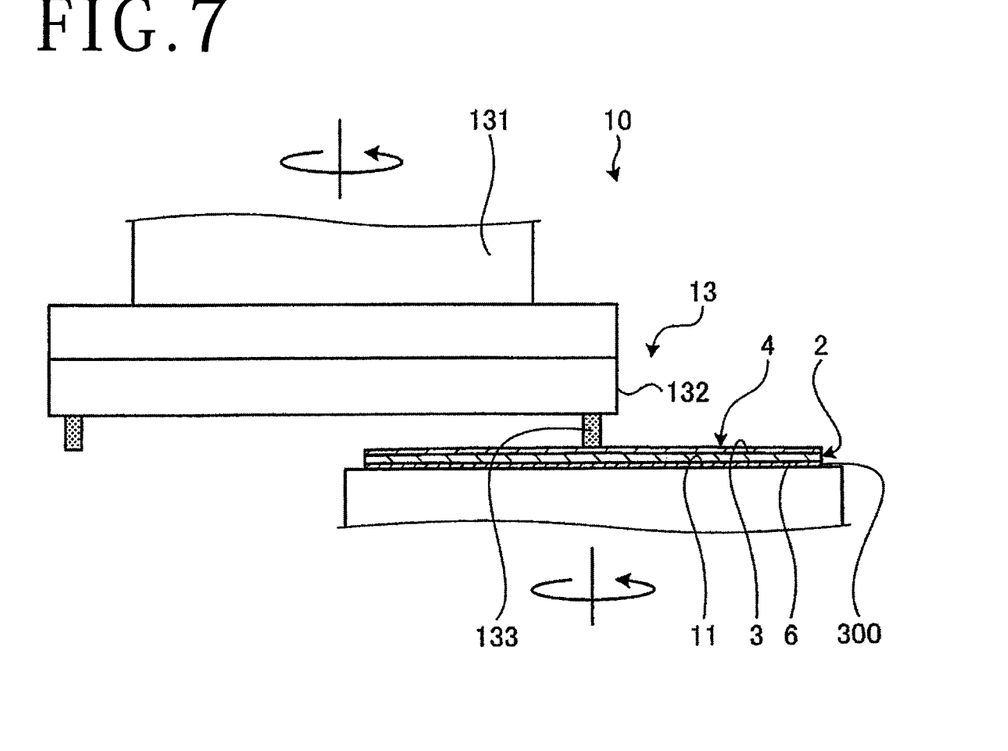
FIG. 7 is a partially sectional side view depicting a finish grinding step of the grinding step in the method of manufacturing the substrate for the acoustic wave device depicted in FIG. 3.

FIG. 6 is a partially sectional side view depicting a rough grinding step of a grinding step in the method of manufacturing the substrate for the acoustic wave device depicted in FIG. 3. FIG. 7 is a partially sectional side view depicting a finish grinding step of the grinding step in the method of manufacturing the substrate for the acoustic wave device depicted in FIG. 3. The grinding step ST2 is a step of holding the support substrate 2 side by a chuck table 11 of a grinding apparatus 10 and grinding and thinning the piezoelectric material layer 4, after the substrate joining step ST1. The grinding step ST2 includes a rough grinding step ST21 and a finish grinding step ST22. The grinding step ST2 is conducted by the grinding apparatus 10 which is provided with a plurality of chuck tables 11 (depicted in FIGS. 6 and 7) on a turntable (not depicted) rotated about an axis, and includes a rough grinding unit 12 (depicted in FIG. 6) for rough grinding of the piezoelectric material layer 4, and a finish grinding unit 13 (depicted in FIG. 7) for finish grinding of the piezoelectric material layer 4. However, the grinding apparatus 10 to be used in the grinding step ST2 in the present invention is not limited to the one in Embodiment 1.

In the grinding step ST2, a protective member 300 is adhered to a surface 6 on the other side of the support substrate 2, and then the grinding apparatus 10 holds the support substrate 2 side by each of the plurality of chuck tables 11 provided on the turntable (not depicted). In the rough grinding step ST21, the grinding apparatus 10 rotates the turntable, positions the support substrate 2 beneath the rough grinding unit 12, and supplies grinding water while rotating a grinding wheel 122 for rough grinding by a spindle 121 and rotating the chuck table 11 about the axis, as depicted in FIG. 6. In the rough grinding step ST21, the grinding apparatus 10 brings a rough grinding grindstone 123 close to the chuck table 11 at a predetermined feed rate, thereby rough-grinding the surface of the piezoelectric material layer 4.

In the finish grinding step ST22, the grinding apparatus 10 rotates the turntable to position the support substrate 2 beneath the finish grinding unit 13, and supplies grinding water while rotating a grinding wheel 132 for finish grinding by a spindle 131 and rotating the chuck table 11 about the axis, as depicted in FIG. 7. In the finish grinding step ST22, the grinding apparatus 10 brings a finish grinding grindstone 133, which is finer in abrasive grain size than the rough grinding grindstone 123, close to the chuck table 11 at a predetermined feed rate, thereby finish-grinding the surface of the piezoelectric material layer, 4.

After the finish grinding, the grinding apparatus 10 releases the suction holding of the support substrate 2 by the chuck table 11, and performs cleaning and the like. Note that the rough grinding grindstone 123 used in the grinding step ST2 in Embodiment 1 is a grindstone in which a bonding material is a metal and which contains abrasive grains of #320 to #800, whereas the finish grinding grindstone 133 is a grindstone in which a bonding material is a resin and which contains abrasive grains of #1000 to #2000. However, the grindstones 123 and 133 used in the present invention are not limited to these ones. In this way, in the grinding step ST2, the surface of the piezoelectric material layer 4 is rough-ground by the rough grinding grindstone 123, and then the surface of the piezoelectric material layer 4 is finish-ground by the finish grinding grindstone 133 finer in abrasive grain size than the rough grinding grindstone 123, thereby to reduce the amount to be removed by a pulsed laser beam 400 (depicted in FIG. 10) and to restrain irregular reflection of measurement light 21 of an optical thickness meter 20 (depicted in FIG. 8) to be used in the removal amount map forming step ST3. After the grinding step ST2, the manufacturing method proceeds to the removal amount map forming step ST3.

<Removal Amount Map Forming Step>

Figure 8:
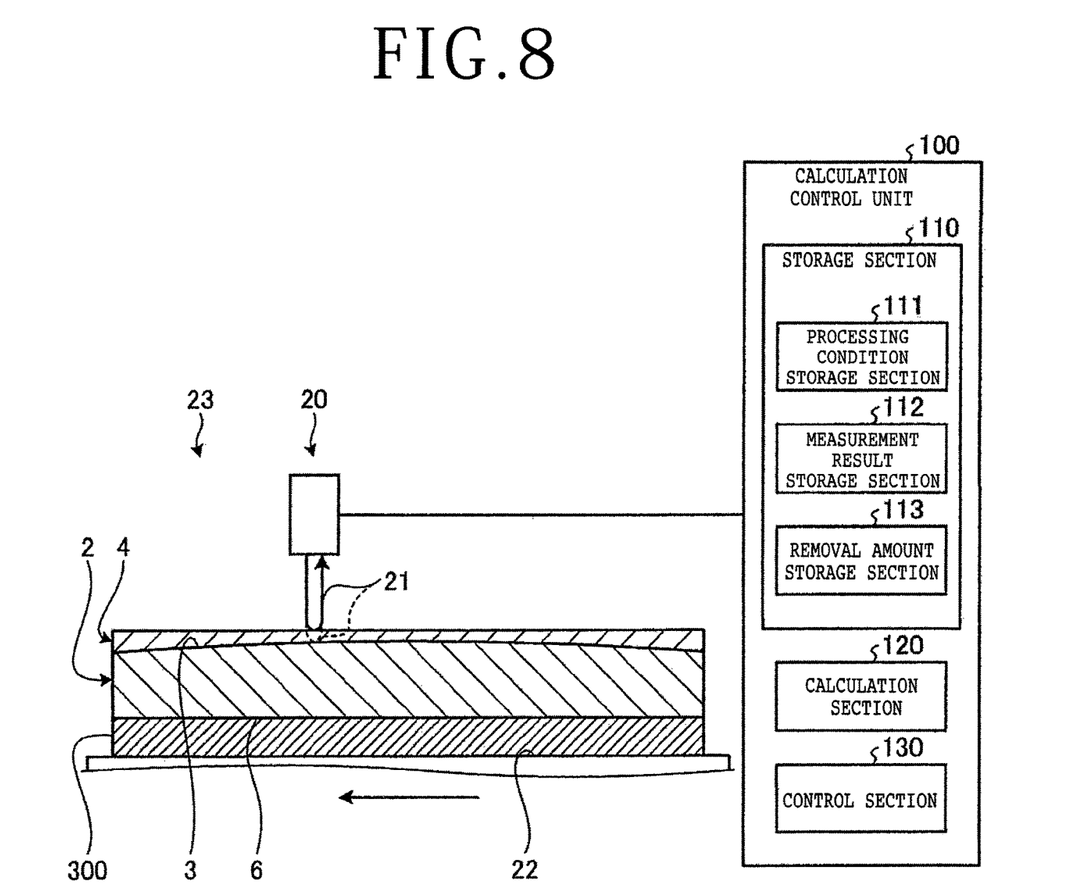
FIG. 8 is a partially sectional side view depicting a removal amount map forming step in the method of manufacturing the substrate for the acoustic wave device depicted in FIG. 3.
Figure 9:
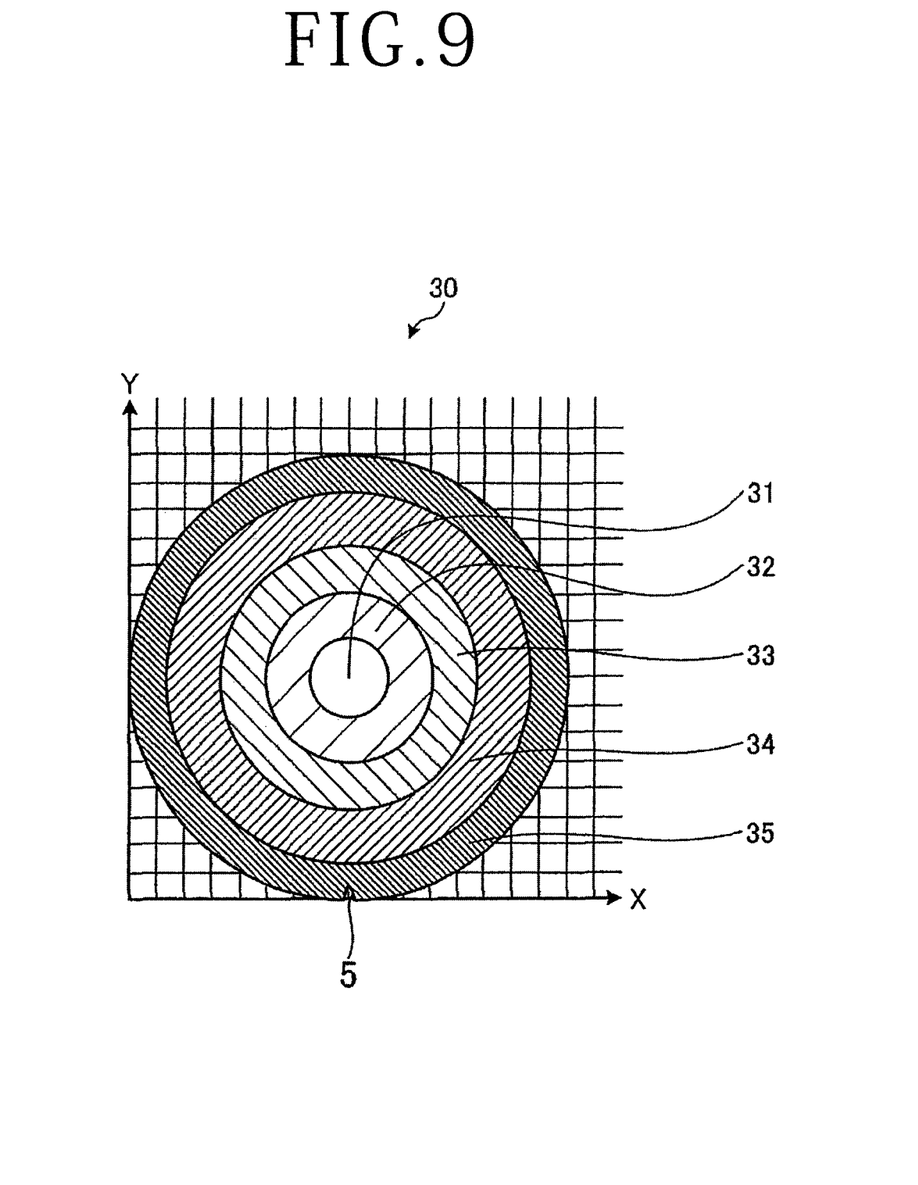
FIG. 9 is a plan view depicting an example of a removal amount map formed by the removal amount map forming step in the method of manufacturing the substrate for the acoustic wave device depicted in FIG. 3.

FIG. 8 is a partially sectional side view depicting a removal amount map forming step in the method of manufacturing the substrate for the acoustic wave device depicted in FIG. 3. FIG. 9 is a plan view depicting an example of a removal amount map formed in the removal amount map forming step in the method of manufacturing the substrate for the acoustic wave device depicted in FIG. 3.

The removal amount map forming step ST3 is a step of measuring the in-plane thickness of the piezoelectric material layer 4 by the optical thickness meter 20 depicted in FIG. 8, calculating a removal amount for the piezoelectric material layer 4 for adjusting the thickness variability of the piezoelectric material layer 4, or the difference between the thickness of the thinnest portion and the thickness of the thickest portion, to or below a threshold on the basis of each coordinate in the plane, and forming a removal amount map 30 depicted in FIG. 9, after the grinding step ST2. The optical thickness meter 20 measures the thickness of the piezoelectric material layer 4 by a process in which the measurement light 21, for example, infrared light, is applied toward the piezoelectric material layer 4, and reflected lights from the front surface and the back surface of the piezoelectric material layer 4 are received. The optical thickness meter 20 is supported to be movable in directions parallel to the surface of the piezoelectric material layer 4 by a driving unit (not depicted), and outputs measurement results to a calculation control unit 100 depicted in FIG. 8.

The calculation control unit 100 is a unit that calculates the removal amount map 30 depicted in FIG. 9, based on the results of measurement by the optical thickness meter 20. The removal amount map 30 is for prescribing the number of times the pulsed laser beam 400 is to be applied to each position on the surface of the piezoelectric material layer 4 in the laser processing step ST4. In Embodiment 1, the removal amount map 30 prescribes each position on the surface of the piezoelectric material layer 4 in terms of coordinates defined in an X-axis direction and a Y-axis direction intersecting each other, with the notch 5 as a reference. Note that the removal amount map 30 depicted in FIG. 9 provides a prescription in which: the number of times the pulsed laser beam 400 is to be applied to each position 31 in a white area inclusive of the center of the surface of the piezoelectric material layer 4 is zero (times); the number of times the pulsed laser beam 400 is to be applied to each position 32 in an area indicated by coarsest parallel slant lines on the outside of the positions 31 is one (time); the number of times the pulsed laser beam 400 is to be applied to each position 33 in an area indicated by second coarsest parallel slant lines on the outside of the positions 32 is two (times); the number of times the pulsed laser beam 400 is to be applied to each position 34 in an area indicated by third coarsest parallel slant lines on the outside of the positions 33 is three (times); and the number of times the pulsed laser beam 400 is to be applied to each position 35 in an area indicated by densest parallel slant lines on the outermost side is four (times). Note that detailed description of the calculation control unit 100 will be made at the time of describing the laser processing step ST4 later.

In the removal amount map forming step ST3, the support substrate 2 is held on a chuck table 22 of a thickness measuring apparatus 23 through a protective member 300, and, in a state in which the optical thickness meter 20 is set to face the surface of the piezoelectric material layer 4, the calculation control unit 100 causes the optical thickness meter 20 to measure the thickness at each position of the piezoelectric material layer 4 while moving the optical thickness meter 20 in directions parallel to the surface of the piezoelectric material layer 4, and stores the results of measurement. In the removal amount map forming step ST3, the calculation control unit 100 calculates the removal amount map 30 depicted in FIG. 9, from the measurement results and the like. After the removal amount map forming step ST3, the manufacturing method proceeds to the laser processing step ST4.

<Laser Processing Step>

Figure 10:
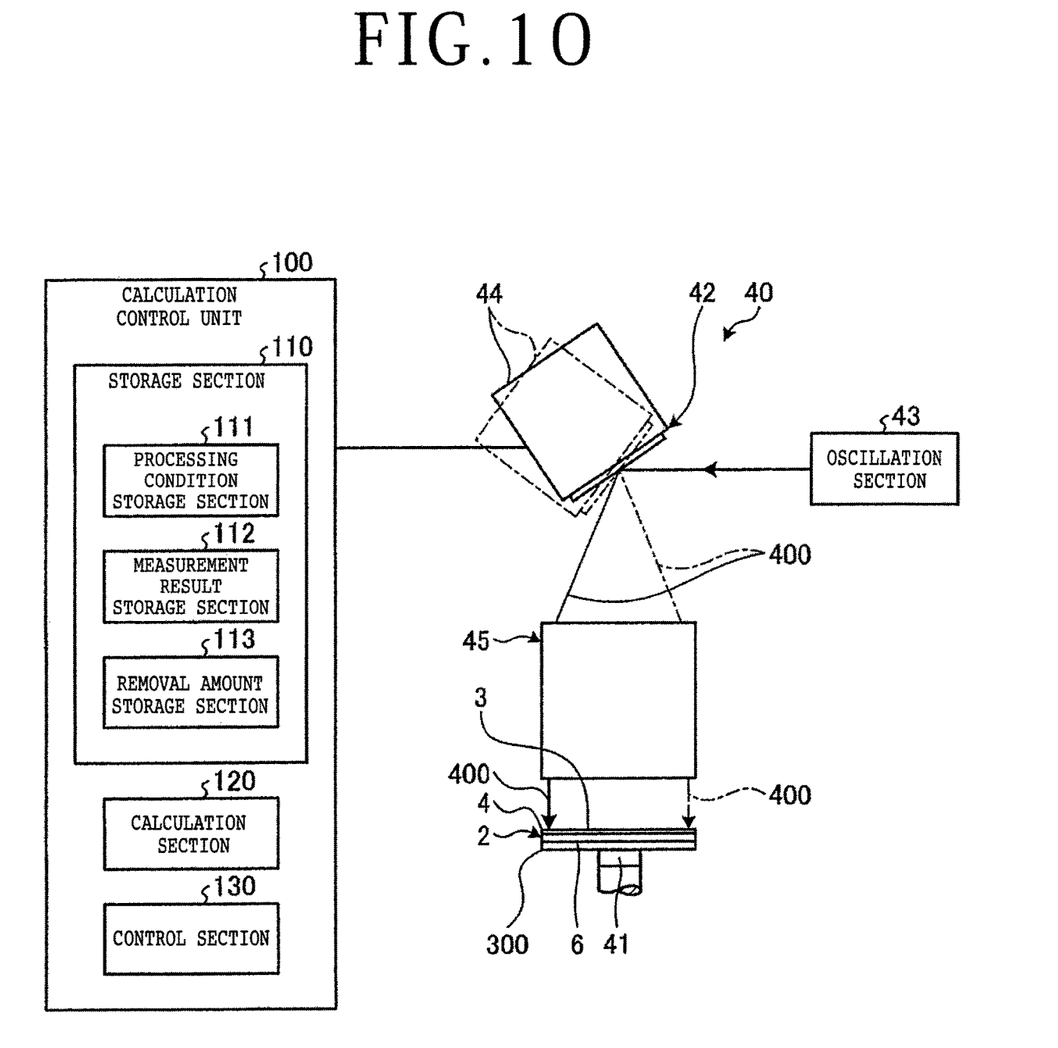
FIG. 10 is a side view depicting a laser processing step in the method of manufacturing the substrate for the acoustic wave device depicted in FIG. 3.
Figure 11:
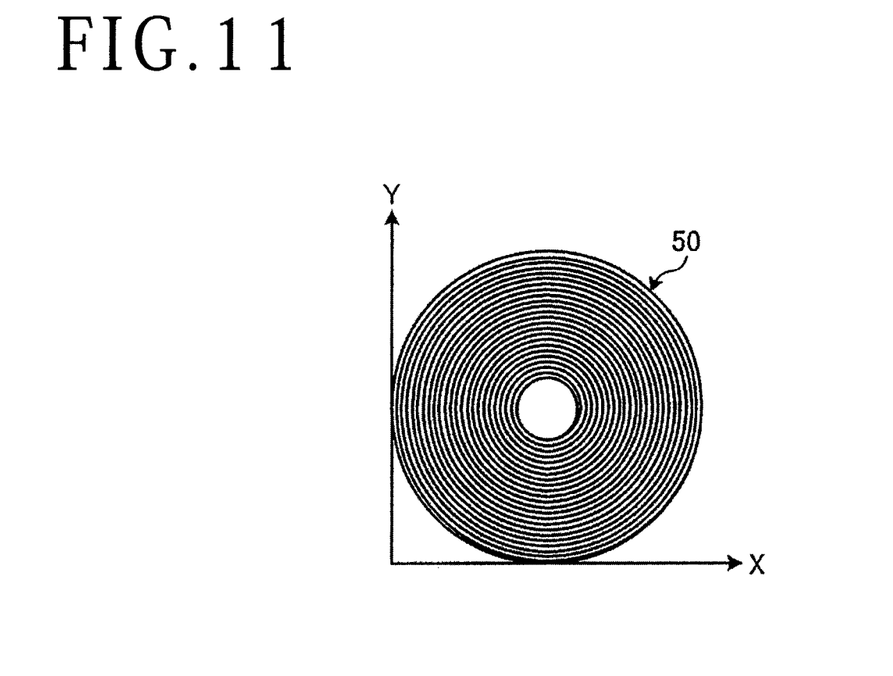
FIG. 11 is a plan view depicting conditions for scanning the piezoelectric material layer with a pulsed laser beam in the laser processing step in the method of manufacturing the substrate for the acoustic wave device depicted in FIG. 3.
Figure 12:
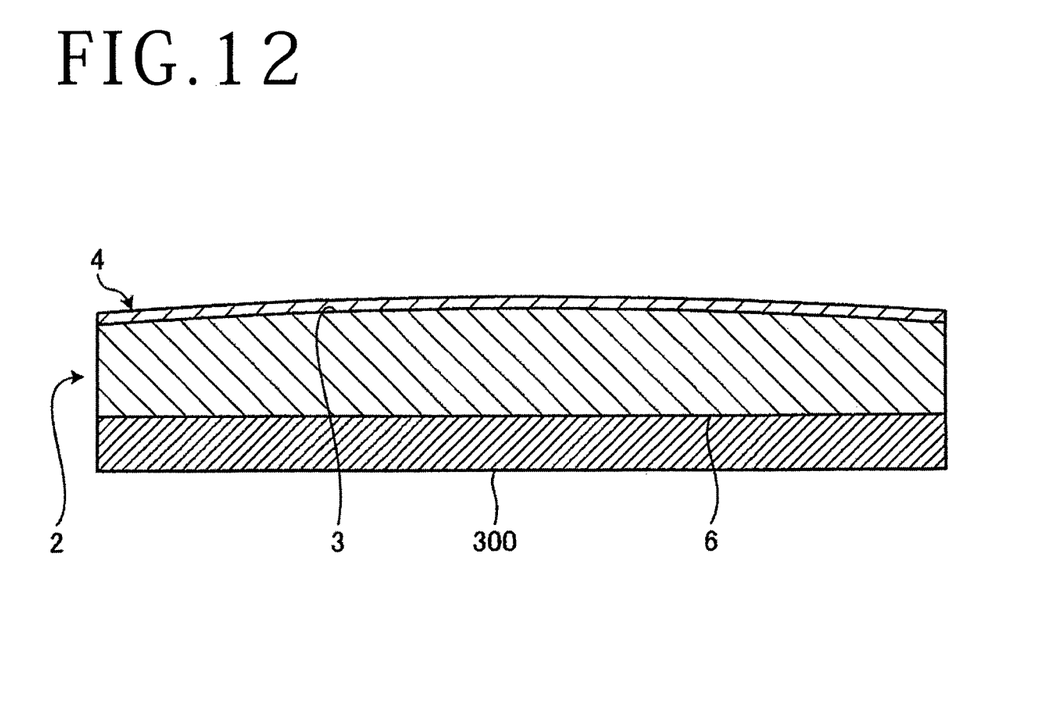
FIG. 12 is a sectional view of the support substrate and the piezoelectric material layer after the laser processing step in the method of manufacturing the substrate for the acoustic wave device depicted in FIG. 3.

FIG. 10 is a side view depicting a laser processing step in the method of manufacturing the substrate for the acoustic wave device depicted in FIG. 3. FIG. 11 is a plan view depicting conditions for scanning the piezoelectric material layer with a pulsed laser beam in the laser processing step in the method of manufacturing the substrate for the acoustic wave device depicted in FIG. 3. FIG. 12 is a sectional view of the support substrate and the piezoelectric material layer after the laser processing step in the method of manufacturing the substrate for the acoustic wave device depicted in FIG. 3.

The laser processing step ST4 is a step of applying the pulsed laser beam 400 of such a wavelength as to be absorbed in the piezoelectric material layer 4 from the front surface of the piezoelectric material layer 4, and selectively removing the piezoelectric material layer 4 by ablation processing to adjust the difference between the thickness of the thinnest portion and the thickness of the thickest portion to or below a threshold, based on the removal amount map 30. In the laser processing step ST4, a laser processing apparatus 40 schematically depicted in FIG. 10 is used.

The laser processing apparatus 40 includes a holding table 41 for holding the support substrate 2, and a laser beam applying unit 42 that applies the pulsed laser beam 400 toward the piezoelectric material layer 4 joined to the support substrate 2 held by the holding table 41. The laser beam applying unit 42 includes an oscillation section 43 that oscillates the pulsed laser beam 400, and an optical system (not depicted) including a beam diameter adjustor, an output adjustor and the like for transmitting the pulsed laser beam 400. In addition, the laser beam applying unit 42 includes a Galvano scanner 44 that deflects the center axis of the pulsed laser beam 400 transmitted by the optical system in such a manner as to move in directions parallel to the surface of the piezoelectric material layer 4 joined to the support substrate 2 held by the holding table 41. The laser beam applying unit 42 includes a condenser 45 composed of an image-side telecentric objective lens for focusing the pulsed laser beam 400, whose center axis has been deflected by the Galvano scanner 44, and applying the pulsed laser beam 400 to the piezoelectric material layer 4 joined to the support substrate 2 held by the holding table 41.

The pulsed laser beam 400 oscillated by the oscillation section 43 is a laser beam which is pulse-shaped, has a wavelength of 257 nm to 355 nm, and is not liable to generate cracks in the piezoelectric material layer 4, and is desirably a fourth harmonic laser beam. In addition, in Embodiment 1, the output of the pulsed laser beam 400 is 1.5 W, and its repetition frequency is 200 kHz. The Galvano scanner 44 is controlled by the calculation control unit 100, and deflects the pulsed laser beam 400 oscillated from the oscillation section 43 to lead it to the condenser 45. Note that in the present invention, a polygon mirror or a piezo mirror can be used in place of the Galvano scanner 44. The condenser 45 is composed of an image-side telecentric objective lens larger in diameter than the support substrate 2 and the piezoelectric material layer 4. The condenser 45 causes the pulsed laser beam 400 to be applied in parallel to an optical axis of the objective lens, independently of the angle of view of the incident angle.

The calculation control unit 100 that forms the removal amount map 30 based on the aforementioned results of measurement by the optical thickness meter 20 and that controls the Galvano scanner 44 of the laser beam applying unit 42 of the laser processing apparatus 40 on the basis of the removal amount map 30 will now be described below. As depicted in FIGS. 8 and 10, the calculation control unit 100 includes a storage section 110, a calculation section 120, and a control section 130. The storage section 110 includes a processing condition storage section 111, a measurement result storage section 112, and a removal amount storage section 113. The processing condition storage section 111 stores, at least: an allowable value for the difference between the thickness of the thinnest portion of the piezoelectric material layer 4 and the thickness of the thickest portion, which is a threshold for variability of thickness of the piezoelectric material layer 4; a target thickness of the piezoelectric material layer 4; and a repetition frequency of the pulsed laser beam 400. The allowable value for the difference between the thickness of the thinnest portion of the piezoelectric material layer 4 and the thickness of the thickest portion, the target thickness of the piezoelectric material layer 4, and the repetition frequency of the pulsed laser beam 400 are inputted from an input unit (not depicted) connected to the calculation control unit 100, and are stored in the processing condition storage section 111.

The measurement result storage section 112 stores the thickness at each position of the piezoelectric material layer 4 as the results of measurement by the optical thickness meter 20. The thickness at each position of the piezoelectric material layer 4 stored by the measurement result storage section 112 is prescribed, in position, by the same coordinates used for the removal amount map 30. The removal amount storage section 113 stores a preliminarily measured removal amount for the piezoelectric material layer 4 per pulse of the pulsed laser beam 400. The removal amount storage section 113 stores, at least: a size to be removed in the thickness direction of the piezoelectric material layer 4 per pulse of the pulsed laser beam 400; and an area to be removed in the surface of the piezoelectric material layer 4. The size to be removed in the thickness direction and the area to be removed in the surface of the piezoelectric material layer 4 are inputted from an input unit (not depicted) connected to the calculation control unit 100, and are stored in the removal amount storage section 113.

In the removal amount map forming step ST3, the calculation section 120 calculates, on the basis of each coordinate in the plane, the removal amount for the piezoelectric material layer 4 for adjusting the difference between the thickness of the thinnest portion of the piezoelectric material layer 4 and the thickness of the thickest portion to or below the allowable value, based on the results of measurement by the optical thickness meter 20 of the in-plane thickness of the piezoelectric material layer 4 ground by the grinding apparatus 10 after joined to the surface 3 on one side of the support substrate 2, and forms the removal amount map 30. The calculation section 120 calculates the removal amount map 30 depicted in FIG. 9, by referring to the information stored in the processing condition storage section 111, the measurement result storage section 112 and the removal amount storage section 113. The calculation section 120 calculates the amount to be removed in the thickness direction at each position of the piezoelectric material layer 4, from the thickness at each position of the piezoelectric material layer 4 stored in the measurement result storage section 112 as well as the allowable value and the target value stored in the processing condition storage section 111. The calculation section 120 calculates the removal amount map 30, from the amount to be removed in the thickness direction at each position of the piezoelectric material layer 4 and the size to be removed in the thickness direction stored in the removal amount storage section 113.

In addition, in the removal amount map forming step ST3, the calculation section 120 calculates scanning conditions 50 (an example of which is depicted in FIG. 11) for the pulsed laser beam 400 to be applied in the laser processing step ST4, from the removal amount map 30, the repetition frequency of the pulsed laser beam 400 stored in the processing condition storage section 111, the area removed in the surface of the piezoelectric material layer 4 per pulse of the pulsed laser beam 400 stored in the removal amount storage section 113, and the like. The scanning conditions 50 include at least a moving route and a moving speed of the pulsed laser beam 400 on the surface of the piezoelectric material layer 4, for realizing application of the pulsed laser beam 400 each number of times and at each position which are prescribed by the removal amount map 30. In this way, the scanning conditions 50 for the pulsed laser beam 400 applied in the laser processing step ST4 are determined from the preliminarily measured removal amount of the piezoelectric material layer 4 per pulse of the pulsed laser beam 400. Note that the scanning conditions 50 one example of which is depicted in FIG. 11 are conditions for moving the pulsed laser beam 400 spirally on the surface of the piezoelectric material layer 4, exclusive of the positions 31 depicted in FIG. 9.

In the laser processing step ST4, the control section 130 causes the pulsed laser beam 400 of such a wavelength as to be absorbed in the piezoelectric material layer 4 to be applied from the laser beam applying unit 42 to the surface of the piezoelectric material layer 4 to selectively remove the piezoelectric material layer 4 by ablation processing, thereby adjusting the difference between the thickness of the thinnest portion of the piezoelectric material layer 4 and the thickness of the thickest portion to or below an allowable value, based on the removal amount map 30. In the laser processing step ST4, the control section 130 controls the Galvano scanner 44 according to the scanning conditions 50 calculated by the calculation section 120, to apply the pulsed laser beam 400 to the surface of the piezoelectric material layer 4, thereby applying ablation processing to the surface of the piezoelectric material layer 4.

The calculation control unit 100 is a computer that includes a processing apparatus having a microprocessor such as a CPU (Central Processing Unit), a storage apparatus having a memory such as a ROM (Read Only Memory) or RAM (Random Access Memory), and an input/output interface, and that is able to execute a computer program. The processing apparatus of the calculation control unit 100 executes the computer program stored in the ROM on the RAM, to realize functions of the calculation section 120 and the control section 130. Functions of the processing condition storage section 111, the measurement result storage section 112 and the removal amount storage section 113 of the storage section 110 are realized by storage apparatuses. In addition, the calculation control unit 100 is connected to a display unit (not depicted) composed of, for example, a liquid crystal display for displaying status of a processing operation, images and the like, and an input unit to be used when the operator enters information on the contents of processing. The input unit is composed of at least one of a touch panel provided on the display unit, a keyboard and the like.

In the laser processing step ST4, the support substrate 2 is held by the holding table 41 through the protective member 300, and the piezoelectric material layer 4 is set facing the laser beam applying unit 42. In the laser processing step ST4, the control section 130 of the calculation control unit 100 controls the Galvano scanner 44 according to the scanning conditions 50 calculated by the calculation section 120, and applies the pulsed laser beam 400 to the surface of the piezoelectric material layer 4 in accordance with the scanning conditions 50, to apply ablation processing to the surface of the piezoelectric material layer 4. Since the scanning conditions 50 are calculated based on the removal amount map 30 and the like, the thickness of the piezoelectric material layer 4 after the ablation processing is substantially uniform, as depicted in FIG. 12. After the laser processing step ST4, the manufacturing method proceeds to the polishing step ST5. Note that in Embodiment 1, the same calculation control unit 100 has been used both in the removal amount map forming step ST3 and in the laser processing step ST4. However, the computer for calculation of the removal amount map 30 in the removal amount map forming step ST3 and the computer for ablation processing in the laser processing step ST4 may be different, in the present invention.

<Polishing Step>

Figure 13:
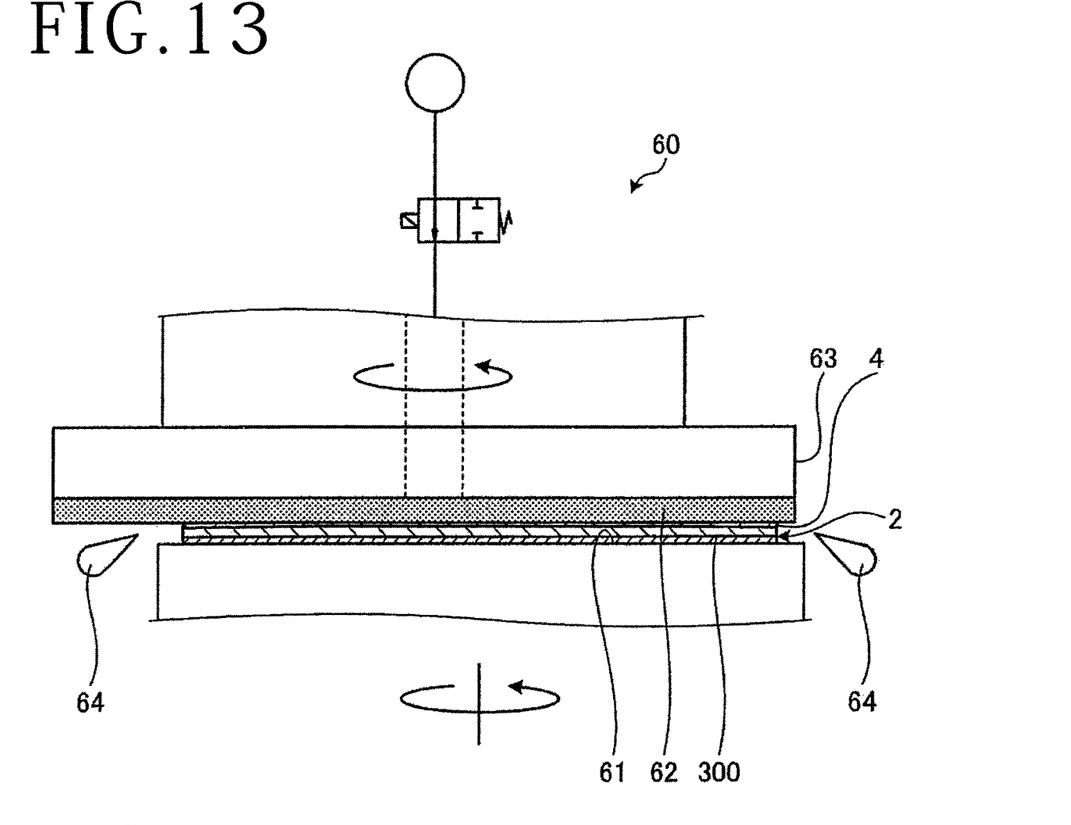
FIG. 13 is a partially sectional side view depicting a polishing step in the method of manufacturing the substrate for the acoustic wave device depicted in FIG. 3.
Figure 14:
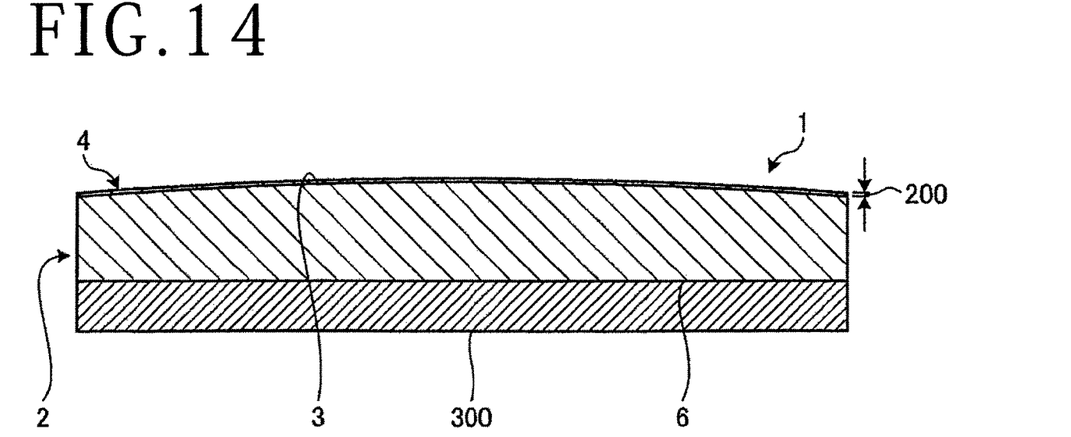
FIG. 14 is a sectional view of the substrate for the SAW filter after the polishing step in the method of manufacturing the substrate for the acoustic wave device depicted in FIG. 3.

FIG. 13 is a partially sectional side view depicting a polishing step in the method of manufacturing the substrate for the acoustic wave device depicted in FIG. 3. FIG. 14 is a sectional view of a substrate for a SAW filter after the polishing step in the method of manufacturing the substrate for the acoustic wave device depicted in FIG. 3.

The polishing step ST5 is a step of holding the support substrate 2 side by a chuck table 61 of a polishing apparatus 60, and polishing the surface of the piezoelectric material layer 4 by a polishing pad 62, to form the piezoelectric material layer 4 of a predetermined thickness while maintaining in-plane thickness variability, after the laser processing step ST4. In the polishing step ST5, the polishing apparatus 60 holds the support substrate 2 on the chuck table 61 through the protective member 300, and, as depicted in FIG. 13, bringing the polishing pad 62 into contact with the piezoelectric material layer 4 while rotating the chuck table 61 and a polishing wheel 63 about axes and while supplying a polishing fluid 64, to polish the surface of the piezoelectric material layer 4. In the polishing step ST5, the surface of the piezoelectric material layer 4 is polished, whereby the piezoelectric material layer 4 is thinned, and ruggedness and debris generated in the ablation processing are removed.

Note that in Embodiment 1, the polishing fluid 64 is a solution containing a substance which undergoes a chemical reaction with the piezoelectric material layer 4 to permit CMP (Chemical Mechanical Polishing) to be conducted, and, for example, an alkaline polishing fluid is used. For this reason, in Embodiment 1, the polishing step ST5 is CMP processing in which the surface of the piezoelectric material layer 4 is subjected to CMP. However, dry polishing of polishing the surface of the piezoelectric material layer 4 without supplying the polishing fluid 64 may be conducted in the present invention. The piezoelectric material layer 4 after the polishing step ST5 is formed in a predetermined thickness 200 due to overall thinning as compared to its state upon the laser processing step ST4 as depicted in FIG. 14.

As has been described above, in the manufacturing method according to Embodiment 1, the piezoelectric material layer 4 is joined to the support substrate 2 in the substrate joining step ST1, the piezoelectric material layer 4 is ground in the grinding step ST2, and then the piezoelectric material layer 4 is selectively removed by use of ablation processing in the laser processing step ST4. In the manufacturing method according to Embodiment 1, the piezoelectric material layer 4 in its thicker portions is removed in the laser processing step ST4, based on the removal amount map 30 calculated by measuring the thickness of the piezoelectric material layer 4 in the removal amount map forming step ST3. As a result, by the manufacturing method according to Embodiment 1, a SAW filter substrate 1 in which thickness variability of the piezoelectric material layer 4 is small can be formed at low cost, without conducting ion injection or the like. Therefore, by the manufacturing method according to Embodiment 1, thickness variability of the piezoelectric material layer 4 can be suppressed while suppressing the cost of the SAW filters.

In the manufacturing method according to Embodiment 1, the scanning conditions 50 in the laser processing step ST4 are determined from the removal amount per pulse of the pulsed laser beam 400. Therefore, it is possible to suppress thickness variability of the piezoelectric material layer 4 while suppressing the cost of the SAW filters.

In the manufacturing method according to Embodiment 1, in the grinding step ST2, the finish grinding step ST22 is conducted after the rough grinding step ST21, to restrain irregular reflection of measurement light 21 of the optical thickness meter 20; therefore, measurement errors of the thickness of the piezoelectric material layer 4 can be suppressed.

In the manufacturing method according to Embodiment 1, in the laser processing step ST4, the pulsed laser beam 400 of such a wavelength as to be absorbed in the piezoelectric material layer 4, which beam can be oscillated at lower cost than an ion beam, is applied; therefore, the cost of SAW filters can be restrained from rising.

The present inventors have confirmed the effect of the manufacturing method according to Embodiment 1. The results are depicted in Table 1 below.

TABLE 1

|  | Thickness Variability |
| --- | --- |
| Product of Present Invention | Small |
| Product of Comparative Example | Large |

Table 1 depicts the results of evaluation of thickness variability conducted through measurement of the difference between the thickness of the thickest portion of the piezoelectric material layer 4 of the SAW filter substrate 1 and the thickness of the thinnest portion, for the products manufactured by the manufacturing method according to the present invention and that according to Comparative Example. The product of the present invention is a SAW filter substrate 1 manufactured by the manufacturing method according to Embodiment 1. The product of Comparative Example is a SAW filter substrate 1 manufactured by omitting the removal amount map forming step ST3 and the laser processing step ST4 of the manufacturing method according to Embodiment 1.

According to Table 1, the difference between the thickness of the thickest portion of the piezoelectric material layer 4 of the product of Comparative Example and the thickness of the thinnest portion was 6 μm at maximum, and thus the thickness variability of the piezoelectric material layer 4 was large. In contrast, the difference between the thickness of the thickest portion of the piezoelectric material layer 4 of the product of the present invention and the thickness of the thinnest portion was 1 μm at maximum. Thus, it was verified that by carrying out the removal amount map forming step ST3 and the laser processing step ST4, it is possible to suppress thickness variability of the piezoelectric material layer 4.

Note that according to the aforementioned method of manufacturing the substrate for the acoustic wave device according to Embodiment 1, the following calculation control unit can be obtained.

<Supplementary Note>

A calculation control unit including: a calculation section that calculates, on the basis of each coordinate in the plane, a removal amount for a piezoelectric material layer ground by a grinding apparatus after joined to a surface on one side of a support substrate, for adjusting thickness variability of the piezoelectric material layer to or below a threshold, based on the results of measurement of in-plane thickness of the piezoelectric material layer by an optical thickness meter, to form a removal amount map; and a control section that causes a pulsed laser beam of such a wavelength as to be absorbed in the piezoelectric material layer to be applied from a laser beam applying unit to a surface of the piezoelectric material layer, to selectively remove the piezoelectric material layer by ablation processing, based on the removal amount map, and thereby to adjust the thickness variability to or below the threshold.

The calculation control unit removes the piezoelectric material layer in its thicker portions, based on the removal amount map calculated through measurement of the thickness of the piezoelectric material layer, like in the method of manufacturing the substrate for the acoustic wave device according to Embodiment 1. Therefore, it is possible to suppress thickness variability of the piezoelectric material layer while suppressing the cost of the SAW filters.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing a substrate for an acoustic wave device, the substrate having a piezoelectric material layer with a predetermined thickness formed along a surface on one side of a support substrate, the method comprising:
   a joining step of joining the piezoelectric material layer to the surface on the one side of the support substrate to form a composite substrate, said composite substrate having a notch that indicates a crystal orientation of said composite substrate;
   a grinding step of holding the support substrate side by a chuck table of a grinding apparatus and grinding and thinning the piezoelectric material layer, after the joining step;
   a removal amount map forming step of measuring in-plane thickness of the piezoelectric material layer by an optical thickness meter, calculating a removal amount for the piezoelectric material layer for adjusting thickness variability of the piezoelectric material layer to or below a threshold on a basis of coordinates defined in an X-axis and a Y-axis relative to said notch that intersect each other in the in-plane thickness, and forming a removal amount map based on the calculated removal amounts, after the grinding step;
   a laser processing step of applying a pulsed laser beam of such a wavelength as to be absorbed in the piezoelectric material layer from a surface of the piezoelectric material layer, and selectively removing the piezoelectric material layer by ablation processing, based on the removal amount map forming step, to adjust the thickness variability to or below the threshold; and
   a polishing step of holding the support substrate side by a chuck table of a polishing apparatus, and polishing the surface of the piezoelectric material layer by a polishing pad, to form the piezoelectric material layer of a predetermined thickness while maintaining the in-plane thickness variability, after the laser processing step.

2. The method of manufacturing the substrate for the acoustic wave device according to claim 1, wherein scanning conditions of the pulsed laser beam applied in the laser processing step are determined from a removal amount of the piezoelectric material layer per pulse that is preliminarily measured.

3. The method of manufacturing the substrate for the acoustic wave device according to claim 2, wherein the scanning conditions of the pulsed laser beam applied in the laser processing step are different for at least two positions on said piezoelectric material layer, wherein said at least two positions are at different coordinates on the X-axis and the Y-axis.

4. The method of manufacturing the substrate for the acoustic wave device according to claim 2, wherein the scanning conditions include at least one moving rate and a moving speed of the pulsed laser beam on the surface of the piezoelectric material layer.

5. The method of manufacturing the substrate for the acoustic wave device according to claim 1, wherein in the grinding step, the surface of the piezoelectric material layer is ground by a rough grinding grindstone, after which the surface of the piezoelectric material layer is finish-ground by a finish grinding grindstone finer in abrasive grain size than the rough grinding grindstone, to restrain irregular reflection of measurement light of the optical thickness meter.

6. The method of manufacturing the substrate for the acoustic wave device according to claim 1, wherein the polishing step is chemical mechanical polishing processing.

7. The method of manufacturing the substrate for the acoustic wave device according to claim 1, wherein the support substrate is lower in thermal expansion coefficient than the piezoelectric material layer, and is a semiconductor or an insulating material.

8. The method of manufacturing the substrate for the acoustic wave device according to claim 1, wherein the joining step includes joining the piezoelectric material layer to the surface on the one side of the support substrate by adhering the piezoelectric material layer to the surface with an adhesive.

9. The method of manufacturing the substrate for the acoustic wave device according to claim 1, wherein the joining step includes directly joining the piezoelectric material layer to the surface on the one side of the support substrate by application of an ion beam of an inert gas.

* * * * *